(12) United States Patent
Arai et al.

(10) Patent No.: US 6,717,793 B2
(45) Date of Patent: Apr. 6, 2004

(54) SURFACE MOUNT TYPE CONDENSER

(75) Inventors: Satoshi Arai, Minato-ku (JP); Koichiro Masuda, Minato-ku (JP)

(73) Assignee: NEC Tokin Corporation, Miyagi (JP)

( * ) Notice: Subject to any disclaimer, the term of this patent is extended or adjusted under 35 U.S.C. 154(b) by 178 days.

(21) Appl. No.: 10/106,388

(22) Filed: Mar. 27, 2002

(65) Prior Publication Data

US 2002/0144897 A1 Oct. 10, 2002

(30) Foreign Application Priority Data

Apr. 9, 2001 (JP) ........................................ 2001-110399

(51) Int. Cl.[7] .............................................. H01G 4/228
(52) U.S. Cl. .................... 361/306.1; 361/309; 361/528; 361/532
(58) Field of Search .............................. 361/306.1, 309, 361/329, 330, 517–520, 529, 532, 535–538, 540

(56) References Cited

U.S. PATENT DOCUMENTS

| | | | | |
|---|---|---|---|---|
| 5,548,473 A | * | 8/1996 | Wang ...................... | 361/301.1 |
| 6,118,646 A | * | 9/2000 | Yang et al. ............... | 361/301.3 |
| 6,157,544 A | * | 12/2000 | Ferling et al. .............. | 361/800 |
| 6,356,431 B1 | * | 3/2002 | Lin et al. .................... | 361/307 |
| 6,459,564 | * | 10/2002 | Watanabe et al. ........... | 361/502 |

* cited by examiner

*Primary Examiner*—Anthony Dinkins
(74) *Attorney, Agent, or Firm*—Sughrue Mion, PLLC

(57) ABSTRACT

Surface mount type condenser, which is capable of preventing transmission of electromagnetic wave between anode terminals and excellent in its noise removal performance in a high frequency region, having two anode portions and a substantially planar plate-shape first metallic plate sandwiched by two substantially planar plate-shape cathode portions, one of which being formed with a cathode terminal and connected thereto in a manner confronting a substrate, the two anode portions being provided with two anode terminals formed thereon and connected thereto in a manner of confronting the substrate, and characterized in that a substantially planar plate-shape second metallic plate electrically connected to a surface of the other of the cathode portions is provided in a manner of covering a predetermined region of the anode terminals.

16 Claims, 3 Drawing Sheets

SURFACE MOUNT TYPE CONDENSER

BACKGROUND OF THE INVENTION

1. Field of the Invention

The present invention relates to a surface mount type condenser or capacitor, which is mounted on a substrate and is mainly used as a noise filter.

2. Description of the Related Art

Reduction in the size of an electronic power supply has rapidly been developed accompanied by an advancement of high-performance, a downsizing, and a reduction in the weight of electronic parts in recent years.

The reduction in the size of the electronic power supply can be achieved by increasing the operational frequency of the power supply to a high frequency level. However, requirements for the performance of electronic parts used for an electronic power supply circuit employing such power supply, particularly, the performance of a noise filter surface mounted on a substrate, i.e., a condenser has become more and more strict. As a surface mount type condenser capable of meeting such strict requirements for the performance, an aluminum solid electrolytic condenser employing an electro-conductive functional polymer as a cathode and surface mounted on a substrate has been developed and brought into practical use.

Compared with a conventional aluminum condenser or tantalum condenser, this aluminum solid electrolytic condenser is advantageous in that the equivalent series resistance thereof is 1/20 through 1/50 of that of the above-mentioned conventional aluminum or tantalum condenser.

FIG. 1 is a cross-sectional view of the conventional constitution of a surface mount type condenser.

As shown in FIG. 1, conventional surface mount type condenser has such a constitution that two substantially planar-plate shape cathodes 2 sandwich a first metallic plate 7 in the shape of a planar plate. Two cathodes 2 are vertically connected to one another at the sides thereof.

Therefore, respective faces of cathodes 2, which are not in contact with first metallic plate 7 form surfaces of two cathodes 2, and one of such surfaces, i.e., a surface 2a is connected to cathode terminal 4, and opposite ends of first metallic plate 7 projecting from between two cathodes 2 forms two anodes. On the respective ends of these anodes are formed two anode terminals 5, which are connected, respectively, to lands 11 arranged on substrate 6.

Further, in order to prevent occurrence of short-circuiting of cathodes 2 (cathode terminals 4) and anodes 3 (anode terminals 5), either electrical insulation layers are provided on the surfaces of anodes 3 and anode terminals 5 or surface mount type condenser 1 per se is sealed by insulating resin.

Accordingly, when this surface mount type condenser 1 is mounted on substrate 6, direct current containing noise inputted from one of anode terminals 5 is filtered, and the direct current component only is output to the other of anode terminals 5.

However, with the conventional surface mount type condenser, in a high frequency region equal to or more than 10 MHz, such a phenomenon conspicuously occurs that a part of noise input in one of the anode terminals is transmitted as an electromagnetic wave in the air so as to arrive at the other of the anode terminals. Namely, when such phenomenon occurs, since signals input in one of the anode terminals is transmitted as an electromagnetic wave (noise) in the air to short-circuit to the other of the anode terminals, it is difficult to thoroughly remove noise in the signals. This fact means that in the high frequency region equal to or more than 10 MHz, sufficient removal of noise could not hitherto achieved.

SUMMARY OF THE INVENTION

Taking into consideration the above-described problems encountered by the prior art, an object of the present invention is to provide a surface mount type condenser capable of preventing transmission of electromagnetic wave between anode terminals and being excellent in its noise removal performance in a high frequency region.

A surface mount type condenser according to a first invention of the present patent application, provided for solving the above-described problems of the prior art, comprises: two anode portions; two anode terminals connected to respective of the two anode portions in a manner of confronting a substrate; two planar plate-shape cathode portions; a first substantially planar plate-shape metallic plate sandwiched by the two cathode portions and including the two anode portions; a cathode terminal connected to one of the cathode portions in a manner of confronting the substrate; and a second substantially planar plate-shape metallic plate electrically connected to a surface of the other of the cathode portions and arranged in a manner of covering predetermined regions of the anode terminals.

According to the above-described constitution, when high-frequency electric current is permitted to flow into the surface mount type condenser, an action of electromagnetic wave discharged particularly from the anode terminals can be suppressed between the anode terminals and the second metallic plate.

At this stage, the second metallic plate is provided not for interrupting the passage of the electromagnetic wave so as to prevent transmission of the electromagnetic wave between the two anode terminals but for electrically suppressing the action of the electromagnetic wave by an arrangement in which the second metallic plate electrically connected to the cathode portions having electrolyte confronts the anode terminals.

Accordingly, an occurrence of short-circuiting of the electromagnetic wave in the air due to transmission of the electromagnetic wave between the two anode terminals can be cancelled, and an appropriate removal of noise by the surface mount type condenser can be effected, so that noise can be more efficiently removed in the case of high frequency range.

Further, the above-mentioned predetermined regions indicate regions of the anode terminals, which should be covered by the second metallic plate when the second metallic plate is arranged for covering portions of the anode terminals to an extent such that the action of the electromagnetic wave can be electrically suppressed.

A surface mount type condenser according to a second invention of the present patent application comprises a substantially planar plate-shape second metallic plate connected to a surface of the other of the cathode portions and having a surface thereof confronting the surfaces of anode terminals.

According to the above-described constitution, a phenomenon of short-circuiting of electromagnetic wave in the air, namely transmission of the electromagnetic wave between the two anode terminals can be decreased.

At this stage, the second metallic plate of this constitution may be arranged to confront the surfaces of the anode terminals in compliance with an arrangement requested by the function of the surface mount type condenser.

Namely, at least a portion of the surface of the second metallic plate may be arrange to confront a portion of the surfaces of the anode terminals. Hereby, a decrease in a space necessary for the installation of the surface mount type condenser, and reduction in the manufacturing cost thereof can be achieved.

A surface mount type condenser according to a third invention of the present patent application comprises a substantially planar plate-shape second metallic plate connected to a surface of the other of the cathode portions and having a surface thereof confronting the whole of surfaces of the anode terminals.

According to this constitution, the electromagnetic wave discharged from the surfaces of at least two anode terminals can be suppressed by the confronting surface of the second metallic plate having an area equal to or greater than those of the surfaces of the anode terminals, so that appropriate removal of noise can be achieved by the surface mount type condenser, and further the removal of noise in the high frequency range can be more efficiently achieved.

A surface mount type condenser according to a fourth invention of the present patent application is characterized in that the second metallic plate has a surface thereof provided with a layer of magnetic material formed thereon.

According to this constitution, the magnetic field that generates for the reason that the positive polarization (the anode portions and the anode terminals) and the negative polarization (the cathode portions and the cathode terminal) of the surface mount type condenser are of a common phase, is rendered difficult to change its magnetic flux due to provision of the magnetic material layer. As a result, the noise can be damped. Namely, the noise generating in the positive and negative polarizations at the same electric potential, i.e., the so-called common mode noise can be damped.

A surface mount type condenser according to a fifth invention of the present patent application is characterized in that the width of the layer of magnetic material is set to be equal to or larger than that of the first metallic plate.

According to this constitution, since the width of the magnetic material layer is set on the basis of the width of the first metallic plate, the magnetic material layer is formed in a manner such that the layer covers over the first metallic plate, and therefore can surely and efficiently damp the common mode noise.

Further, when a direction in which the first metallic plate projects against a dielectric is defined as an X-direction, the afore-mentioned width of the layer corresponds to the length in a direction orthogonal to the X-direction in an identical plane.

A surface mount type condenser according to sixth and seventh inventions of the present patent application is characterized in that the second metallic plate is extended in a manner of covering side faces of the anode portions.

According to this constitution, the anode terminals and the second metallic plate formed so as to cover over these anode terminals suppress, from the side, the action of the electromagnetic wave discharged from the anode terminals to thereby suppress transmission of the wave between the anode terminals, thus, appropriate removal of noise can be achieved.

A surface mount type condenser according to eighth through tenth inventions of the present patent application is characterized in that both of the mutually confronting surfaces of the second metallic plate and the anode portions are provided with the insulating layer formed thereon, respectively.

According to this constitution, the second metallic plate electrically connected to the cathode portions and the anode terminals are prevented from being electrically short-circuited.

Particularly, even if the second metallic plate and the anode portions (the first metallic plate) were deformed by any stress acting thereon, the provision of the insulating layer can surely insulate the second metallic plate from the anode portions and the anode terminals.

A surface mount type condenser according to eleventh through thirteenth inventions of the present patent application is characterized in that the space through which the second metallic plate and the anode terminals confront is filled with insulating resin.

According to this constitution, electrical insulation is provided between the second metallic plate and the anode terminals by the insulating resin, and the strength of the metallic plate as well as those of the anode terminals and portions, namely the strength of the surface mount type condenser per se can be increased.

More specifically, protection can be provided for a certain kind of member or members liable to be deformed by any stress, such as the second metallic plate and the anode portions (the first metallic plate).

A surface mount type condenser according to fourteenth through sixteenth inventions of the present patent application is characterized in that the whole surround containing the space through which the second metallic plate and the anode terminals confront, is sealed by the insulating resin.

According to this constitution, not only prevention of electric short-circuiting within the surface mount type condenser per se and an increase in the strength thereof but also protection of the second metallic plate and firm fixing of the surface mount type condenser to the substrate on which diverse components are mounted, can be accomplished.

As will be understood from the foregoing description, according to the surface mount type condenser in accordance with the present invention, as the second metallic plate is electrically connected to the cathode portions, and is disposed so as to confront respective of the anode terminals to which electromagnetic wave noise is transmitted, the action of the electromagnetic wave can be suppressed. Therefore, the electromagnetic wave noise which is liable to be discharged into the air can be selectively damped, and accordingly the noise removal performance in the high frequency range equal to or more than 10 MHz can be appreciably increased.

The above and other objects, features and advantages of the present invention will become apparent from the following description, based on the accompanying drawings, which illustrate examples of preferred embodiments of the present invention.

DESCRIPTION OF THE PREFERRED EMBODIMENTS

An explanatory description of the constitution of an embodiment of a surface mount type condenser according to the present invention will be provided hereinbelow, with reference to the drawings.

First Embodiment

Figure 1:
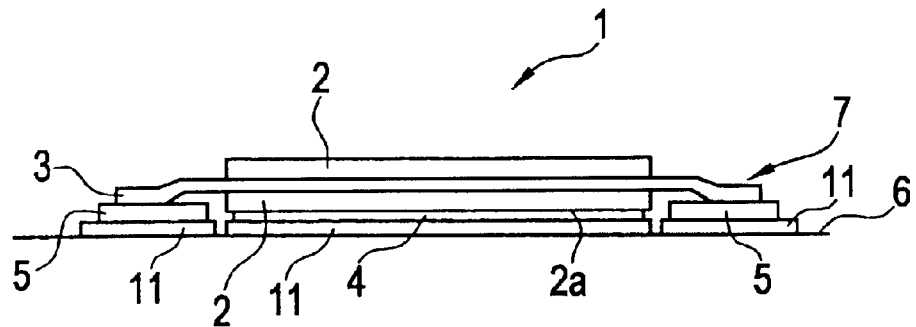
FIG. 1 is a side view illustrating the conventional constitution of a surface mount type condenser.
Figure 2A:
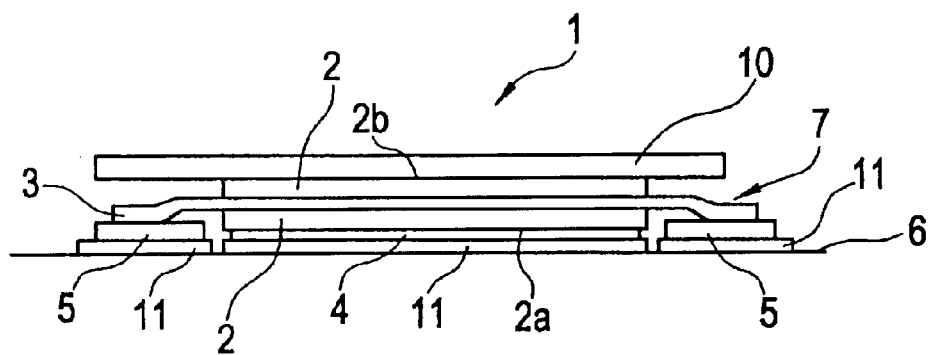
FIGS. 2(a) and 2(b) are side views illustrating the constitution of a first embodiment of a surface mount type condenser according to the present invention, respectively.
Figure 2B:
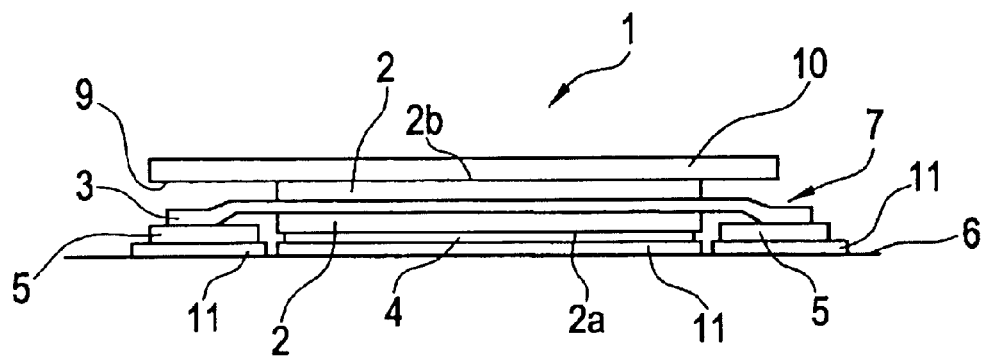

FIGS. 2(a) and 2(b) are side views, respectively, illustrating the constitution of a first embodiment of a surface mount type condenser.

At this stage, it should be understood that, throughout the description of the embodiment of the surface mount type condenser of the present invention, a direction in which the surface mount type condenser is surface-mounted, with reference to a substrate is defined as an upward direction, and an upward face is regarded as an upper face or surface except if any particular note is given.

As shown in FIG. 2(a), surface mount type condenser 1 has a constitution such that two approximately planar plate-shape cathode portions 2 sandwich a first metallic plate 7 in the shape of an approximately planar plate.

At this stage, two cathode portions 2 are comprised etching layer, oxide film layer and functional high polymer layer possessed electrical conductivity, and each layer are formed respectively on metallic plate 7.

Next, the surfaces of two cathode portions 2, namely, the two faces, which are not in contact with first metallic plate 7, form one and the other faces of cathode portions 2 of the surface mount type condenser 1.

That is to say, one of the faces of cathode portions 2 is cathode portion 2a connected to cathode terminal 4, and the other face of cathode portions 2 is located at an upper side at the time of mounting.

First metallic plate 7 are arranged to be projected in antipodal directions against two cathode portions 2, in order to form two anode portions 3 of which respective extreme ends are formed with two anode terminals 5 connected to lands 11 formed on substrate 6 at the time of mounting.

Further, the other face of cathode portions 2 (cathode portion 2b) mounts thereon second metallic plate 10. This second metallic plate 10 is formed in an approximately planar plate-shape, and is electrically connected to the surface of cathode portion 2b while being projected at its extreme ends in a manner similar to first metallic plate 7. More specifically, second metallic plate 10 is arranged so that one face of the projected second metallic plate 10 (this will be hereinafter referred to as the surface of the second metallic plate), which is located on the side facing substrate 6, confronts at least a portion of each of the surfaces of two anode terminals 5.

Further, second metallic plate 10 should desirably be made of a metal having a small electric resistance, such as copper, silver, gold, aluminum, and the like. Furthermore, the metallic material of which second metallic plate 10 is made should desirably be the same as that of anode terminals 5. At this stage, the surface of second metallic plate 10 should desirably be arranged in a manner of covering over and confronting respective anode terminals 5 in order to suppress the action of electromagnetic wave transmitted between two anode terminals 5.

Namely, when viewing from above surface mount type condenser 1 according to the present invention, second metallic plate 10 should desirably be disposed so as to conceal the respective of anode terminals 5. However, the surface of second metallic plate 10 may be disposed so as to confront the surfaces of anode terminals 5 in compliance with an arrangement requested for the function of surface mount type condenser 1, and therefore as indicated by a right side end of second metallic plate 10 of FIGS. 2(a) and 2(b), a construction may be adopted in which second metallic plate 10 does not cover over one of anode terminals 5.

That is to say, at least a portion of the face of second metallic plate 10 may be arranged so as to confront a portion of the surface of anode terminal 5, and hereby, a decrease in a space necessary for the installation of surface mount type condenser 1 and a reduction in the manufacturing cost thereof can be achieved.

Accordingly, second metallic plate 10 of surface mount type condenser 1 should desirably be constructed in such a manner that it is electrically connected to cathode portion 2b, and that at least any one of faces confronting anode terminals 5 is formed so as to cover confronting anode terminal 5.

Further desirably, when viewing from above surface mount type condenser 1, the lands 11 embedded in the substrate and mounting thereon anode terminals 5 should be concealed by second metallic plate 2. This constitution is adopted for preventing occurrence of transmission of the electromagnetic wave between the lands 11 and anode terminals 5.

Furthermore, as shown in FIG. 2(b), when insulating layer 9 (for example, insulating tape) is provided on respective confronting faces of second metallic plate 10, anode portions 3, and anode terminals 5, any electrical short-circuiting which might occur due to a reduction in the size of surface mount type condenser 1 can be preliminarily prevented.

Second Embodiment

A description of the second embodiment of the surface mount type condenser will now be provided hereinbelow.

In the description of the present embodiment of the surface mount type condenser, portions duplicating with those of the above-described first embodiment will be omitted except if a particular necessity occurs.

Figure 3:
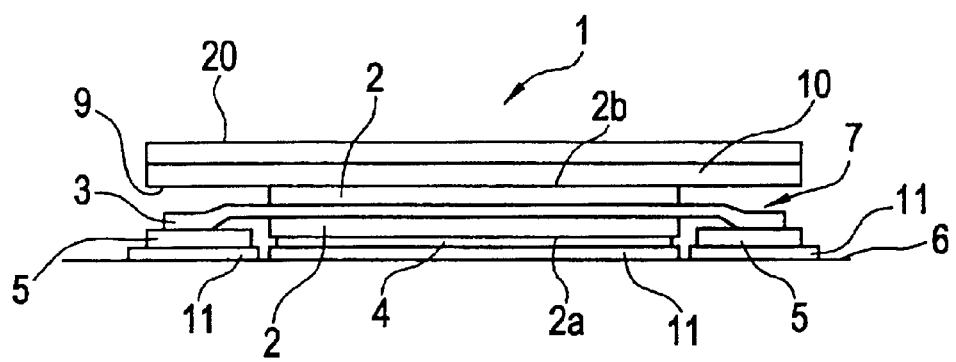
FIG. 3 is a side view illustrating the constitution of a second embodiment of a surface mount type condenser.

FIG. 3 is a side view illustrating the constitution of the second embodiment of the surface mount type condenser according to the present invention.

As shown in FIG. 3, in the second embodiment of the surface mount type condenser, magnetic material layer 20 is formed on the upper surface of second metallic plate 10. The magnetic material forming magnetic material layer 20 may desirably be ferrite, Permalloy, Sendust or silicon steel.

Further, this magnetic material layer 20 may not be formed on the whole of the upper face of second metallic plate 10, and should desirably be formed on an upper face region thereof, so that the layer eventually covers at least the upper face of first metallic plate 7 when viewing from above surface mount type condenser 1. Due to the formation of magnetic material layer 20, the noise that could not be cancelled by the conventional noise filter, and generates in the positive and negative polarizations at the same electric potential, i.e., the so-called common mode noise can be damped.

This is because the magnetic field, which generates for the reason that the positive polarization (the anode portions and the anode terminals) and the negative polarization (the cathode portions and the cathode terminal) of surface mount type condenser 1 are at a common phase, is rendered it difficult to change its magnetic flux by the existence of magnetic material layer 20 to thereby resultantly damp the noise.

Third Embodiment

A description of the third embodiment of the surface mount type condenser according to the present invention will now be provided hereinbelow.

Figure 4A:
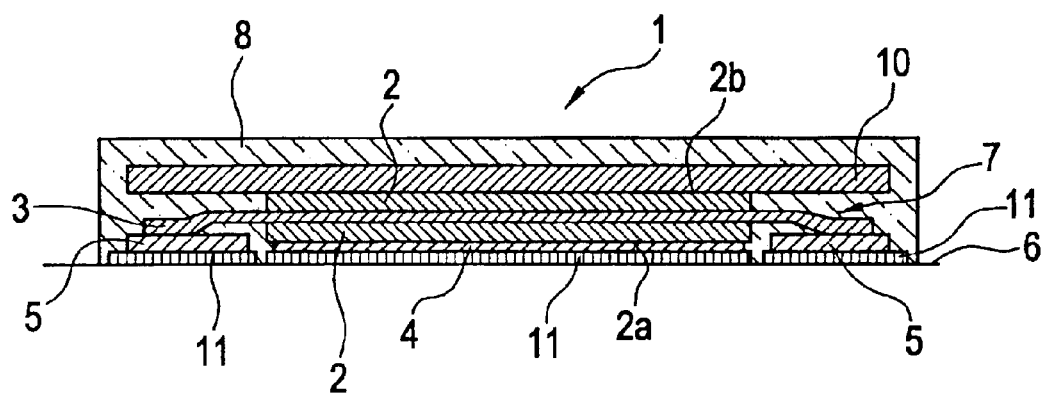
FIGS. 4(a) and 4(b) are cross-sectional views illustrating the constitution of a third embodiment of a surface mount type condenser, respectively.
Figure 4B:
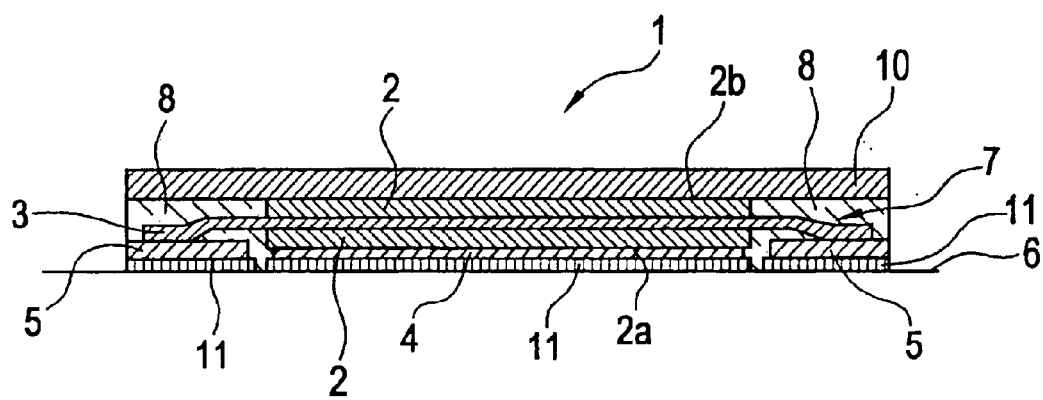

FIGS. 4(*a*) and 4(*b*) are cross-sectional views illustrating the constitution of the third embodiment of the surface mount type condenser according to the present invention.

As shown in FIG. 4(*a*), in the third embodiment of the surface mount type condenser, with respect to the substrate, the entire of surface mount type condenser 1 is sealed by insulating resin 8. This constitution is provided not only for the reason that anode portions 3 and anode terminals 5, and second metallic plate 10 electrically connected to cathode portion 2*b* should not be located at positions where the electrical short-circuiting occurs among those as described before, but also for the reason that the sealing by insulating resin 8 is practical for protecting second metallic plate 10 against damage.

Further, as shown in FIG. 4(*b*), the insulating resin may be filled in a space between second metallic plate 10 and the substrate to thereby apply a partial sealing to the surface mount type condenser.

According to this constitution, an electrical insulation is provided by insulating resin 8 between second metallic plate 10 and anode terminals 5, and the strength of second metallic plate 10 as well as that of anode terminals 5 and anode portions 3 can be increased to result in an increase in the strength of surface mount type condenser 1 per se. More specifically, second metallic plate 10 and anode portions 3 (first metallic plate 7), which are members liable to be deformed by the application of stress, can be surely protected.

Fourth Embodiment

A description of the fourth embodiment of the surface mount type condenser according to the present invention will now be provided hereinbelow.

Figure 5A:
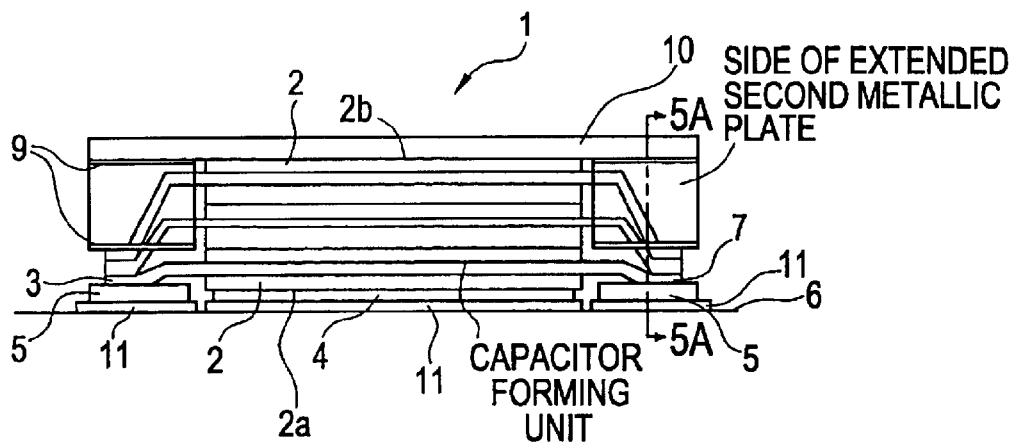
FIGS. 5(a) and 5(b) are side and cross-sectional views illustrating the constitution of a fourth embodiment of a surface mount type condenser; and, FIG. 6 is a graphical view indication the relationship between frequency and the amount of transmission damping in the embodiment of a surface mount type condenser.
Figure 5B:
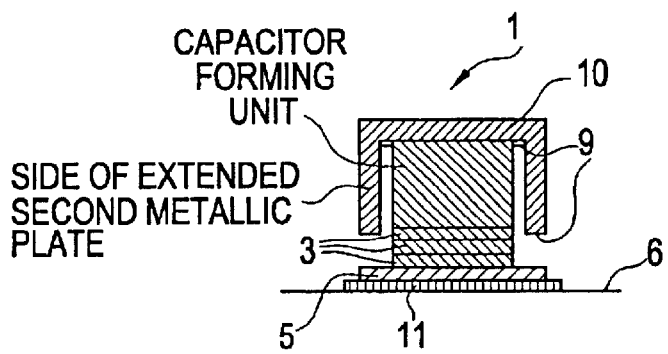

FIGS. 5(*a*) and 5(*b*) are a side view and a cross-sectional view taken along the line A—A of the side view, illustrating the constitution of the fourth embodiment of the surface mount type condenser according to the present invention.

As shown in FIG. 5(*a*), in the fourth embodiment of the present invention,, a constitution in which two cathode portions 2 sandwich a single first metallic plate 7 produces a single capacitor forming unit, and two or more capacitor forming units are vertically upwardly (or downwardly) superimposed on each other in response to an amount of capacity of surface mount type condenser 1 to be amounted.

Specifically, respective cathode portions 2 and cathode terminal 4, which produce the capacitor forming units, are mutually electrically connected, and respective anode portions 5 producing the capacitor forming units are also mutually electrically connected so as to form anode terminals 5 at the extreme end thereof.

Further, like the afore-mentioned embodiments of the present invention, cathode terminal 4 and anode terminals 5 producing the capacitor-forming unit are electrically connected to the lands 11, and second metallic plate 10 is electrically connected to cathode portions 2 producing the capacitor-forming unit in a manner of confronting substrate 6.

When surface mount type condenser 1 provided with these capacitor-forming units has a predetermined height, it might occur that a distance provided between second metallic plate 10 and substrate 6 permits the electromagnetic wave to transmit between anode terminals 5. Then, suppression of the electromagnetic wave transmitting between anode terminals 5 cannot be achieved by only second metallic plate 10 connected to cathode portion 2*b*, and therefore second metallic plate 10 should be extended downwardly so as to cover the side of surface amount type condenser 1.

FIG. 5(*b*) illustrates the construction of downwardly extended second metallic plate 10. As shown in FIG. 5(*b*), second metallic plate 10 has a cross-section in the shape of an inverse U-letter opening toward anode terminals 5 and substrate 6.

At this stage, it is necessary to provide insulating layers 9 made of e.g., an insulating tape, at the ends of extended second metallic plate 10, to prevent the latter plate from being electrically short-circuited to anode terminals 5.

According to this constitution, irrespective of the capacity of surface mount type condenser 1, the electromagnetic wave can be confined in a space formed between second metallic plate 10 connected to cathode portion 2*b* and anode terminals 5, and accordingly generation of noise can be preliminarily prevented.

EXAMPLES

Figure 6:
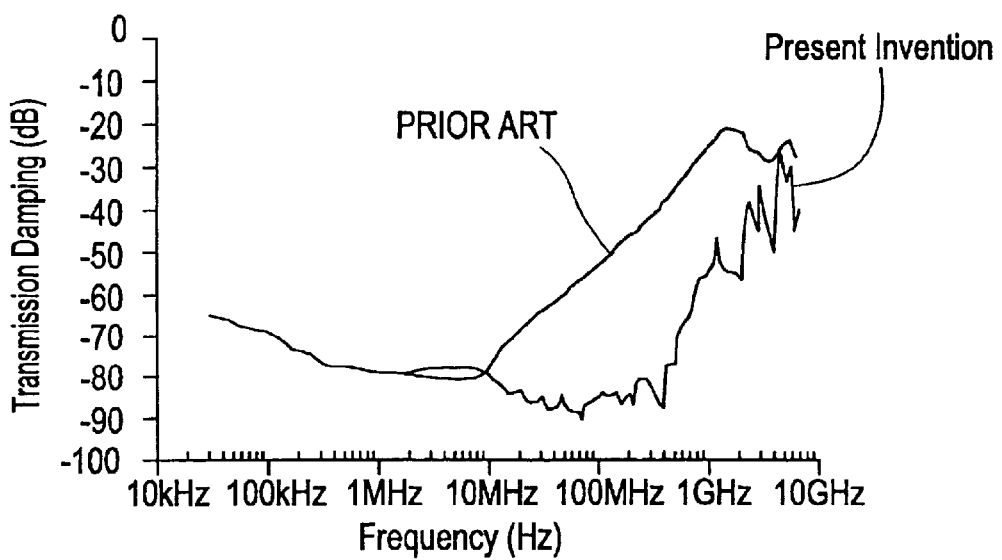

FIG. 6 is a graph indicating a relationship between the frequency and the amount of transmission damping obtained by an example in which surface mount type condenser 1 according to the present invention is surface-mounted under the conditions as set forth below.

Condition 1; the width of the anode terminals: 12 mm

Condition 2; the width of the anode portions: 10 mm

Condition 3; the length of installation region of a pair of anode terminals: 40 mm Condition 4; the material of second metallic plate: aluminum (the same as the anode terminals)

Condition 5; the size of second metallic plate: an extent sufficient for concealing the anode terminals when viewing from above (from the other cathode side)

As shown in FIG. 6, compared with the frequency characteristic of the conventional surface mount type condenser, the surface mount type condenser according to the present invention indicates a remarkable damping performance at around 10 MHz through 1 GHz. Thus, it is understood that transmission of the electromagnetic wave between the anode terminals can be prevented by the second metallic plate of the surface mount type condenser to thereby sufficiently remove the noise.

While preferred embodiments of the present invention have been described using specific terms, such description is for illustrative purpose only, and it is to be understood that changes and variations may be made without departing from the spirit or scope of the following claims.

What is claimed is:

1. A surface mount type condenser comprising:

two anode portions;

two anode terminals connected to respective of said two anode portions in a manner of confronting a substrate;

two planar plate-shape cathode portions;

a first substantially planar plate-shape metallic plate sandwiched by said two cathode portions and including said two anode portions;

a cathode terminal connected to one of said cathode portions in a manner of confronting said substrate; and a second substantially planar plate-shape metallic plate electrically connected to a surface of the other of said cathode portions and arranged in a manner of covering predetermined regions of said anode terminals.

2. The surface mount type condenser according to claim 1, wherein said second metallic plate has a surface thereof confronting the surfaces of anode terminals.

3. The surface mount type condenser according to claim 1, wherein said second metallic plate has a surface thereof confronting the whole of surfaces of said anode terminals.

4. The surface mount type condenser according to claim 1, wherein said second metallic plate has a surface thereof provided with a layer of magnetic material formed thereon.

5. The surface mount type condenser according to claim 4, wherein said layer of magnetic material has a width thereof set to be equal to or larger than that of said first metallic plate.

6. The surface mount type condenser according to claim 1, wherein said second metallic plate is arranged and extended in a manner of covering side faces of said anode portions.

7. The surface mount type condenser according to claim 4, wherein said second metallic plate is arranged and extended in a manner of covering side faces of said anode portions.

8. The surface mount type condenser according to claim 1, wherein both of mutually confronting surfaces of said second metallic plate and said anode portions are provided with an insulating layer formed thereon, respectively.

9. The surface mount type condenser according to claim 6, wherein both of mutually confronting surfaces of said second metallic plate and said anode portions are provided with an insulating layer formed thereon, respectively.

10. The surface mount type condenser according to claim 7, wherein both of mutually confronting surfaces of said second metallic plate and said anode portions are provided with an insulating layer formed thereon, respectively.

11. The surface mount type condenser according to claim 1, wherein a space through which said second metallic plate and said anode terminals confront each other is filled with an insulating resin.

12. The surface mount type condenser according to claim 6, wherein a space through which said second metallic plate and said anode terminals confront each other is filled with an insulating resin.

13. The surface mount type condenser according to claim 7, wherein a space through which said second metallic plate and said anode terminals confront each other is filled with an insulating resin.

14. The surface mount type condenser according to claim 1, wherein the whole surround contain a space through which said second metallic plate and said anode terminals confront each other, is sealed by an insulating resin.

15. The surface mount type condenser according to claim 6, wherein the whole surround contain a space through which said second metallic plate and said anode terminals confront each other, is sealed by an insulating resin.

16. The surface mount type condenser according to claim 7, wherein the whole surround contain a space through which said second metallic plate and said anode terminals confront each other, is sealed by an insulating resin.

* * * * *

UNITED STATES PATENT AND TRADEMARK OFFICE
CERTIFICATE OF CORRECTION

PATENT NO.     : 6,717,793 B2
DATED          : April 6, 2004
INVENTOR(S)    : Satoshi Arai and Koichiro Masuda It is certified that error appears in the above-identified patent and that said Letters Patent is hereby corrected as shown below:

Column 7,
Line 6, delete "invention,," insert -- invention, --.

Signed and Sealed this

Seventh Day of December, 2004

JON W. DUDAS
*Director of the United States Patent and Trademark Office*